US012626039B1

(12) United States Patent
Rashingkar et al.

(10) Patent No.: US 12,626,039 B1
(45) Date of Patent: May 12, 2026

(54) ASSOCIATING PHYSICAL DESIGN METRICS OF A CIRCUIT DESIGN WITH REGISTER TRANSFER LEVEL REPRESENTATIONS OF THE CIRCUIT DESIGN

(71) Applicant: Synopsys, Inc, Mountain View, CA (US)

(72) Inventors: Balkrishna Ramchandra Rashingkar, Sunnyvale, CA (US); Andrew Saunders, Reading (GB); Douglas Chang, San Jose, CA (US); Jeffrey Jude Loescher, Portland, OR (US); Oliver Werner Kozber, Beaverton, OR (US); Liang Tao, Campbell, CA (US); Soumitra Majumder, Kolkata (IN); Colin Williams, Cary, NC (US)

(73) Assignee: Synopsys, Inc., Sunnyvale, CA (US)

( * ) Notice: Subject to any disclaimer, the term of this patent is extended or adjusted under 35 U.S.C. 154(b) by 812 days.

(21) Appl. No.: 17/951,840

(22) Filed: Sep. 23, 2022

Related U.S. Application Data

(60) Provisional application No. 63/247,732, filed on Sep. 23, 2021.

(51) Int. Cl.
*G06F 30/327* (2020.01)
*G06F 8/30* (2018.01)

(52) U.S. Cl.
CPC ............ *G06F 30/327* (2020.01); *G06F 8/311* (2013.01)

(58) Field of Classification Search
USPC ........................................................ 716/102
See application file for complete search history.

(56) References Cited

U.S. PATENT DOCUMENTS

| | | | |
|---|---|---|---|
| 7,451,427 B2 | 11/2008 | Varadarajan | |
| 8,533,647 B1 | 9/2013 | Gangadharan et al. | |
| 8,745,567 B1 | 6/2014 | Varadrajan et al. | |
| 8,782,582 B1 | 7/2014 | Gupta et al. | |
| 8,839,171 B1 | 9/2014 | Varadarajan et al. | |
| 2002/0059553 A1* | 5/2002 | Eng ........................ | G06F 30/392 |
| | | | 716/102 |
| 2006/0053396 A1* | 3/2006 | Eng ......................... | G06F 30/39 |
| | | | 716/135 |
| 2015/0012903 A1* | 1/2015 | Olgiati ................ | G06F 11/2205 |
| | | | 716/136 |
| 2017/0011138 A1 | 1/2017 | Venkatesh et al. | |

* cited by examiner

*Primary Examiner* — Mohammed Alam
(74) *Attorney, Agent, or Firm* — Fenwick & West LLP

(57) ABSTRACT

Design metrics from the physical design of an integrated circuit are made available to the front end designer. Physical design metrics are computed for sub-circuits from the physical design of an integrated circuit. Examples of physical design metrics include metrics for timing, congestion, power consumption and other metrics that depend on physical aspects of the circuit. Correspondence between the sub-circuits and register transfer level (RTL) source elements from RTL source code for the integrated circuit are determined. Examples of RTL source elements include individual lines of RTL source code, modules in the RTL source code, and user-defined constructs in the RTL source code. For different RTL source elements, the physical design metrics for the corresponding sub-circuits are aggregated. These aggregated physical design metrics, including the associations to the corresponding RTL source elements, are made available to users, for example front end designers.

19 Claims, 9 Drawing Sheets

ASSOCIATING PHYSICAL DESIGN METRICS OF A CIRCUIT DESIGN WITH REGISTER TRANSFER LEVEL REPRESENTATIONS OF THE CIRCUIT DESIGN

RELATED APPLICATION

This application claims priority under 35 U.S.C. § 119 (e) to U.S. Provisional Patent Application Ser. No. 63/247,732, "Visualizing Physical Design Metrics of a Circuit Design in a Hardware Description Language Representation of the Circuit Design," filed Sep. 23, 2022. The subject matter of all of the foregoing is incorporated herein by reference in their entirety.

TECHNICAL FIELD

The present disclosure generally relates to an electronic design automation (EDA) system and, more specifically, to propagating physical design information to register transfer level representations of the circuit design.

BACKGROUND

Designing a very large scale integrated (VLSI) chip is a complex process that can be divided into two parts: the front end design and the back end design. These two parts of the design process are typically performed using different methods by different designers. The front end designer works on developing a register transfer level (RTL) description of the design, for example using a hardware description language (HDL). The RTL design is synthesized into a gate level netlist. The back end (or physical) designer takes the gate level netlist and works on the physical aspects of the design implementation, including floor-planning, placement, and routing.

SUMMARY

In certain aspects, design metrics from the physical design are made available to the front end designer. Physical design metrics are computed for sub-circuits from the physical design of an integrated circuit. Examples of physical design metrics include metrics for timing, congestion, power consumption and other metrics that depend on physical aspects of the circuit. Correspondence between the sub-circuits and elements from the RTL source code for the integrated circuit are determined. Examples of RTL source elements include individual lines of RTL source code, modules in the RTL source code and user-defined constructs in the RTL source code. For different RTL source elements, the physical design metrics for the corresponding sub-circuits are aggregated. These aggregated physical design metrics, including the associations to the corresponding RTL source elements, are made available to users, for example to assist in the front end design.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
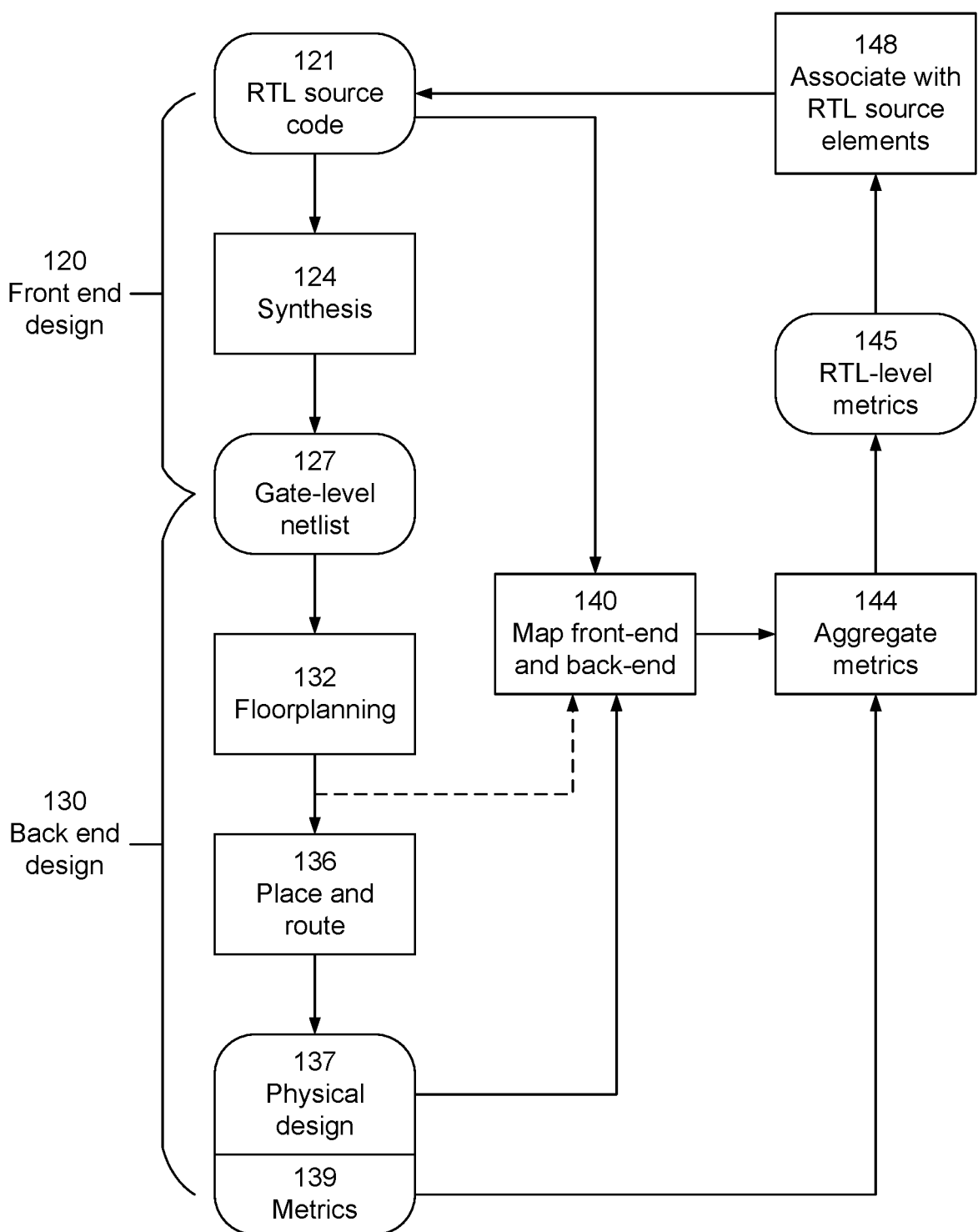
FIG. 1 is a flowchart of a process for propagating back end metrics to a front end design, according to an embodiment.

Aspects of the present disclosure relate to associating physical design metrics of a circuit design with register transfer level (RTL) representations of the circuit design. In a process for designing integrated circuits, front end designers develop register transfer level (RTL) or other functional descriptions of the integrated circuit. They convert these descriptions into a gate-level netlist, using processes such as logical synthesis. Back end designers, also known as physical designers, take the gate-level netlist and develop the physical aspects of the design. Typical processes in the back end design include floorplanning, placement and routing. The resulting physical designs describe the integrated circuit as a set of interconnected circuit blocks, including cells such as may be provided in a cell library.

The physical designs may be simulated or otherwise analyzed to compute metrics that depend on the physical design. These are referred to as physical design metrics. For example, timing concerns the time required for signals to propagate from one point in the design to another point and whether that time is consistent with requirements for the integrated circuit. Timing depends on physical aspects of the design, such as the interconnect distance between the two points, the routing and physical size and shape of those interconnects, the physical design of intermediate circuits between the two points, and cross-talk interference from signals propagating on nearby interconnects. Another example of physical design metrics is congestion. Congestion is the density of interconnects in a local area of the integrated circuit, which depends on the physical routing of interconnects. A final example is power consumption. Power consumption depends on the physical size of the transistors. It also depends on the load driven by transistors, which in turn depends on physical aspects of the circuit design.

The back end designer may use different EDA applications to estimate various physical design metrics. These EDA applications may identify problem areas in the physical design, which the back end designer may then fix. However, some problems may be more easily fixed at the RTL level. For example, a large multiplexer may cause congestion. The physical designer may try to alleviate congestion by padding cells and increasing white space, but this may be difficult or lead to other undesirable consequences. In contrast, at the RTL level, the congestion may be relieved by dividing the large multiplexer into several smaller multiplexers. Even if there are no problems, having insight into physical design metrics will help the front end designer to develop a better RTL design. Unfortunately, there is not much communication between the front end design and the back end design. The front end and back end designers are typically different people on different teams with not much interaction, and the physical design metrics produced by back end tools are not easily propagated back to the front end design.

To address this situation, aspects of this disclosure make physical design metrics available to the front end designer. In some embodiments, physical design metrics are computed for sub-circuits from the physical design of an integrated circuit, for example for individual cells. A mapping between the sub-circuits and register transfer level (RTL) source elements from RTL source code for the integrated circuit are determined. For example, it may be determined RTL source code lines that generate corresponding cells in the physical design. For different RTL source elements, the physical design metrics for the corresponding sub-circuits are aggregated. These aggregated physical design metrics, including the associations to the corresponding RTL source elements, are then made available to users. In one approach, they are displayed as overlays on the RTL source code. In another approach, they may be displayed as a table of RTL source elements and the corresponding aggregated physical design metrics.

Technical advantages of the present disclosure include, but are not limited to, the following. Providing physical design metrics to the front end designer improves the overall design cycle. In some cases, problems in the physical design are the result of issues in the RTL source code. Being able to identify parts of the RTL source code that result in corresponding physical design metrics allows the front end designer to more easily identify and fix or avoid these issues. In addition, some RTL functions may be instantiated multiple times in the physical design. Problems may then be replicated in many or all of these physical instances. The physical designer may have to individually fix each of these instances, compared to the front end designer fixing the underlying RTL function. Even if the physical designer is the one who fixes the problem, knowing that a set of problems all have the same root cause will help the physical designer to make the fixes in a more efficient manner.

FIG. 1 is a flowchart of a process for propagating back end metrics to a front end design, according to an embodiment. The lefthand side of FIG. 1 shows a design flow 110, and the righthand side shows paths for propagating back end metrics to the front end design. The design process 110 includes a front end 120 and a back end 130, as described previously. The front end 120 includes the development of RTL source code 121. The RTL source code 121 may be expressed in a hardware description language (HDL) such as Verilog or VHDL. In the front end design 120, the RTL representation of the integrated circuit is converted to a gate-level netlist 127. This process includes synthesis 124, in which functions in the RTL description are replaced by gate-level implementations.

The back end design 130 takes the gate level netlist 127 and works on the physical aspects of the design implementation, including floorplanning 132 and place and route 136. Floorplanning is an initial physical layout of the integrated circuit. A floorplanned design includes rough placement of cells that implement the functionality of the integrated circuit, a rough boundary (physical area) around those cells, rough placement of input/output pads, and some global routing estimates. Place and route 136 includes more detailed placement of cells, including optimization of the cells, and more detailed routing of interconnects between cells. For the feedback path, FIG. 1 is illustrated using the physical design 137 which is the output of place and route 136. However, other physical designs may also be used. For example, the floorplanned design (output of floorplanning 132) may be used as the physical design for the feedback path as indicated by the dashed arrow in FIG. 1.

Figure 7:
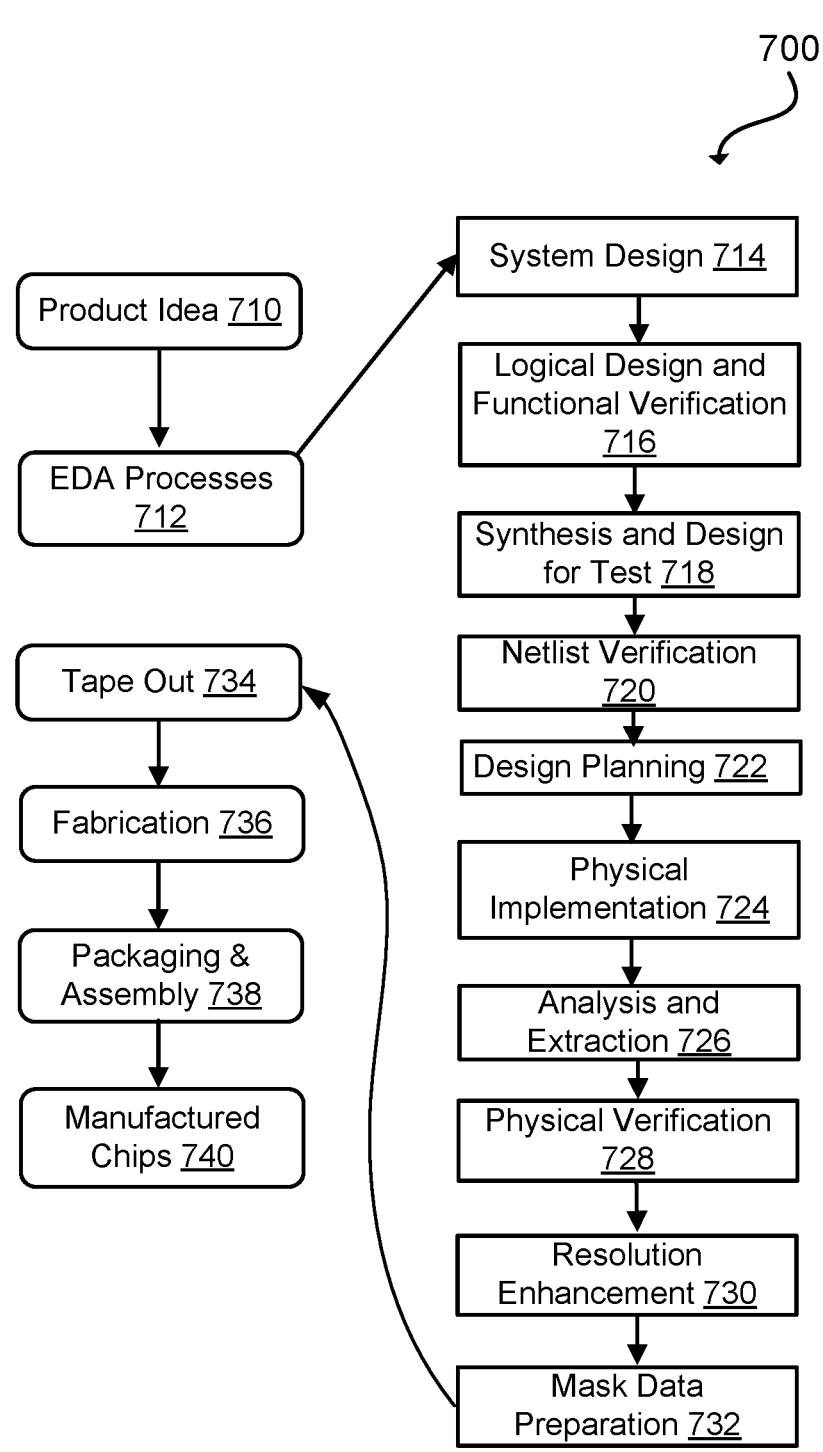
FIG. 7 is a flowchart of various processes used during the design and manufacture of an integrated circuit in accordance with some embodiments of the present disclosure.

In FIG. 1, the design process is shown as a linear flow starting with RTL source code 121 and ending with final physical design 137. However, it should be understood that this process is iterative and may include many more stages than shown in FIG. 1. FIG. 7 below provides a more detailed description of a design flow. Other EDA applications may be used at various stages to assess the current design, based on whether the design is RTL, functional, gate-level, or physical. The results may be used as feedback in the design process to improve the design at that stage. For clarity, not all stages are shown and such feedback paths are also not shown.

FIG. 1 shows a feedback path from the back end 130 to the front end 120. The physical design 137 is characterized by various physical design metrics 139, for example congestion metrics and timing metrics. These may be computed as part of the back end design process 130. At 140, the system determines correspondence between sub-circuits of the physical design 137 and source elements of the RTL source code 121, as described in more detail below. At 144, the system aggregates the physical design metrics 139 based on these mappings. For a specific RTL source element, the physical design metrics for the corresponding sub-circuits are aggregated and associated with that RTL source element. The aggregated physical design metrics 145 represent the physical design metric associated with the corresponding RTL source elements. Hence, they may be referred to as RTL-level physical design metrics, as labeled in FIG. 1.

For example, for the mapping 140, the sub-circuits may be individual cells and the RTL source elements may be individual lines from the RTL source code, which may be identified by file name and line number. The system may determine RTL source code lines that correspond to particular individual cells. In one approach, this information is tracked by EDA applications through the forward design flow as the RTL source code is converted to individual cells. Then the physical design will contain information regarding the RTL source code lines that generate corresponding individual cells. In many cases, this will be a one-to-many mapping. One RTL source code line will result in many individual cells. For each RTL source code line, the physical design metrics for the corresponding cells are aggregated, yielding the RTL-level physical design metric for that RTL source code line.

At 148, the RTL-level physical design metrics are made available to the user (e.g., the front end designer), in a manner that associates the RTL-level physical design metrics with the corresponding RTL source elements. For example, the RTL-level physical design metrics may be overlaid on a design environment for the RTL source code. Individual RTL source code lines may be annotated with the corresponding RTL-level physical design metrics. The information may also be presented on a graphical user interface as a table that associates RTL source elements with corresponding physical design metrics. The aggregate metrics at the RTL level allow a front end designer to better understand the impact of RTL design on the metrics at the physical design level, thereby providing feedback from the physical design to the RTL design for the front end designer.

Figure 2:
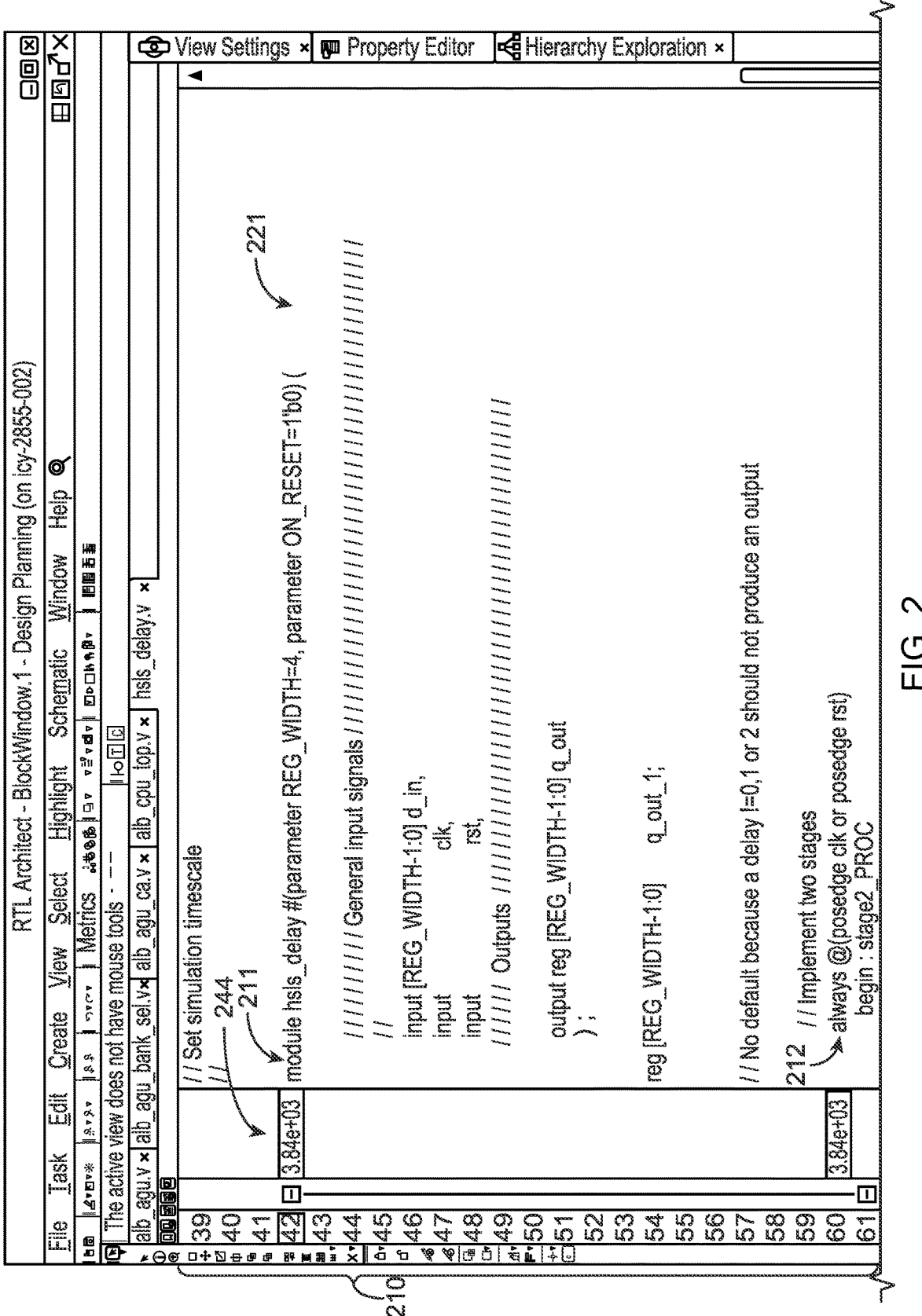
FIG. 2 shows a user interface for a design environment for RTL source code according to an embodiment.
Figure 2:
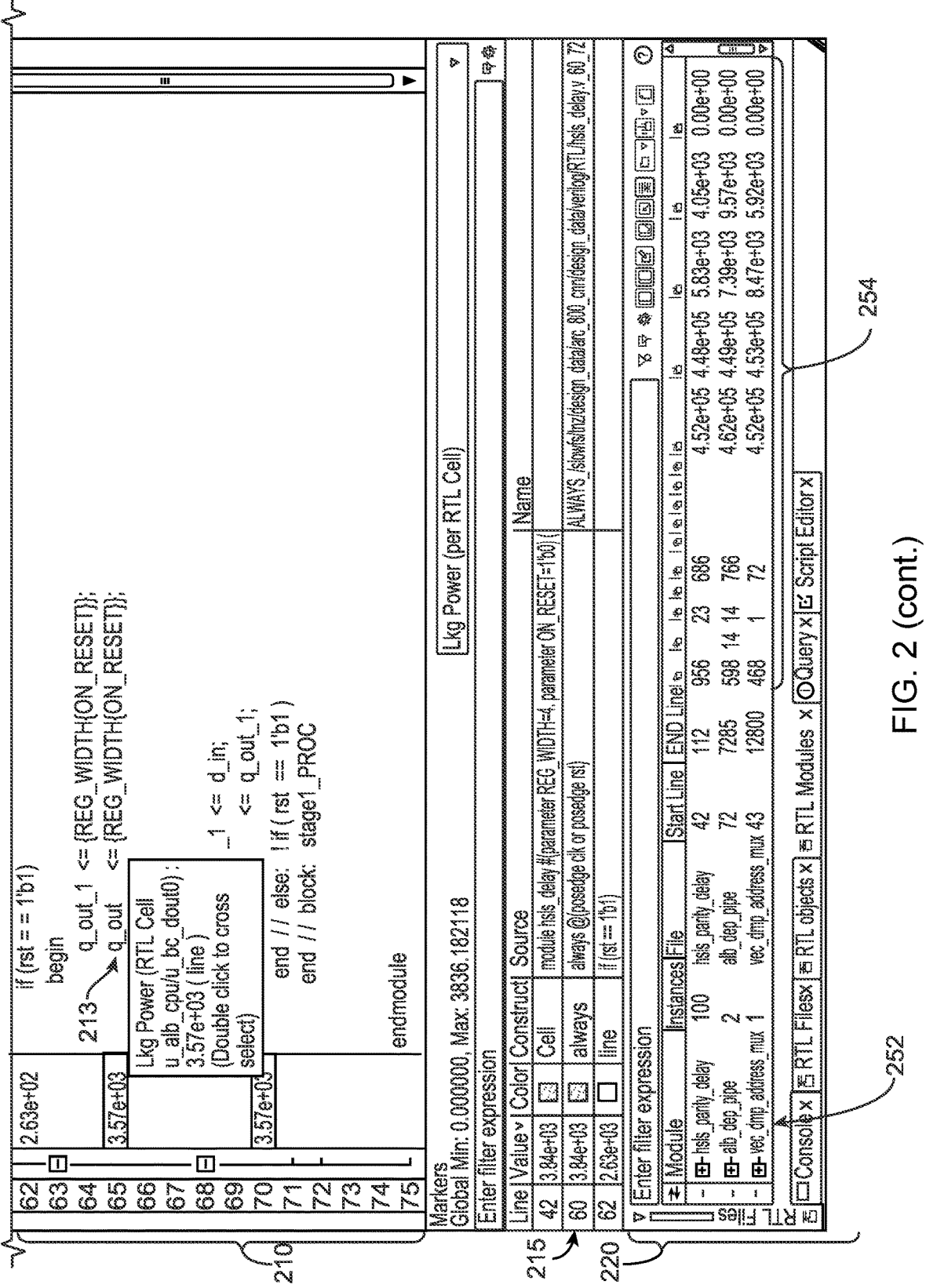

FIG. 2 shows a user interface for a design environment for RTL source code according to an embodiment. In FIG. 2, the physical design metrics are aggregated at the RTL module level. In this particular example, the physical design metric is leakage power. The top window 210 shows a listing of the RTL source code 221. The window 210 includes a left margin 244 which lists the aggregate leakage power for different RTL source elements. For the RTL module hsls_delay identified by reference number 211, the left margin lists 3.84e+03 as the aggregate leakage power for this module. For the RTL construct always_ff @(posedge_clk or posedge_rst) identified by reference number 212, the left margin lists 3.84e+03 as the aggregate leakage power for this construct. For the RTL source code line q_out<= (REG_WIDTH(ON_RESET)) identified by reference number 213, the left margin lists 3.57e+03 as the aggregate leakage power for this construct. These aggregate numbers are also color coded and summarized in the bottom pane 215 of the window. For example, line 42 and RTL module hsls_delay are at the top of this listing 215 as the RTL element with the highest leakage power.

The bottom window 220 is a table that lists different modules and corresponding metrics. The first column 252 lists different RTL modules. Columns 254 list the values of different aggregate physical design metrics. Examples include cell count, cell padding, logic congestion, congested cells, channel congestion, congestion overflow, bottleneck cells, logic level violation, total negative slack, number of violating endpoints total, worst negative slack total, total power, internal power, switching power, leakage power, and glitch power.

Physical design metrics may be aggregated over different RTL source elements, including files, individual lines, and modules. They may also be aggregated over user-defined RTL constructs. RTL constructs are sub structures in RTL modules to help define the module functionality. Some examples of RTL constructs include always@ blocks, while loops, generate for loops, and functions.

Figure 3:
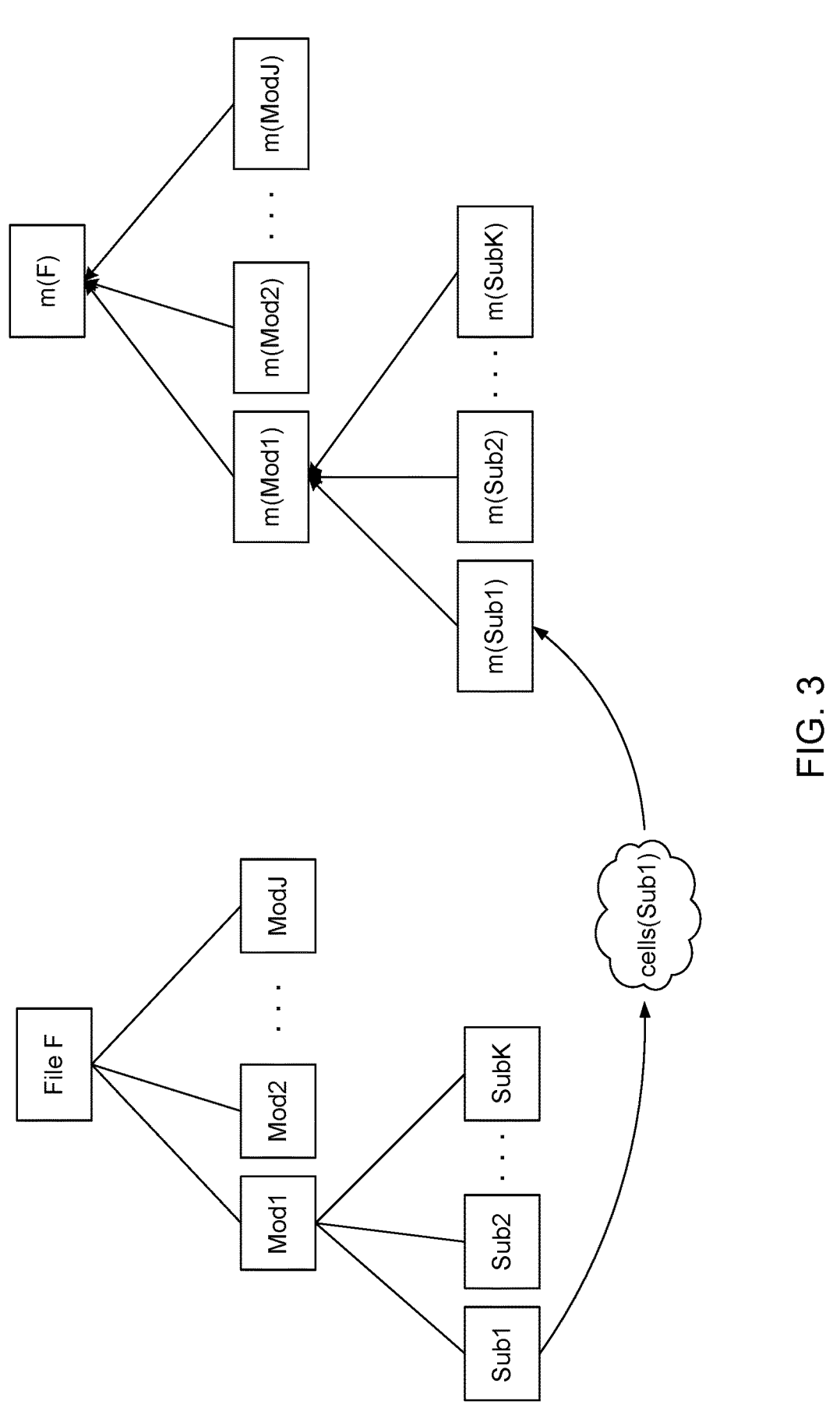
FIG. 3 shows an RTL hierarchy according to an embodiment.

FIGS. 3-6 show some examples of aggregation over different hierarchies. FIG. 3 shows an RTL hierarchy instance tree according to an embodiment. In this example, the top node of the tree is file F. File F includes RTL modules Mod1, Mod2, . . . ModJ. Mod1 includes sub-modules Sub1, Sub2, . . . SubK. Sub1 includes a certain number of RTL source code lines, each of which generates corresponding cells. In FIG. 3, the cloud cells (Sub1) represents the set of leaf cells in the physical design generated by the source code of Sub1. m(Sub1) is the corresponding aggregated physical design metric, which is the physical design metric aggregated over the set of cells (Sub1). Similarly, RTL-level metrics may be computed for the other sub-modules Subk, and these may be further aggregated to compute RTL-level metrics for the modules Modj and for file F.

Metrics may also be aggregated over other bases. For example, RTL source code may include reference modules which are instantiated multiple times. In FIG. 3, assume that modules Mod1 and Mod2 are two instances of the same reference module ModA. Metrics may be aggregated across the instances Mod1 and Mod2 in order to compute RTL-level metrics for reference module ModA.

Figure 4:
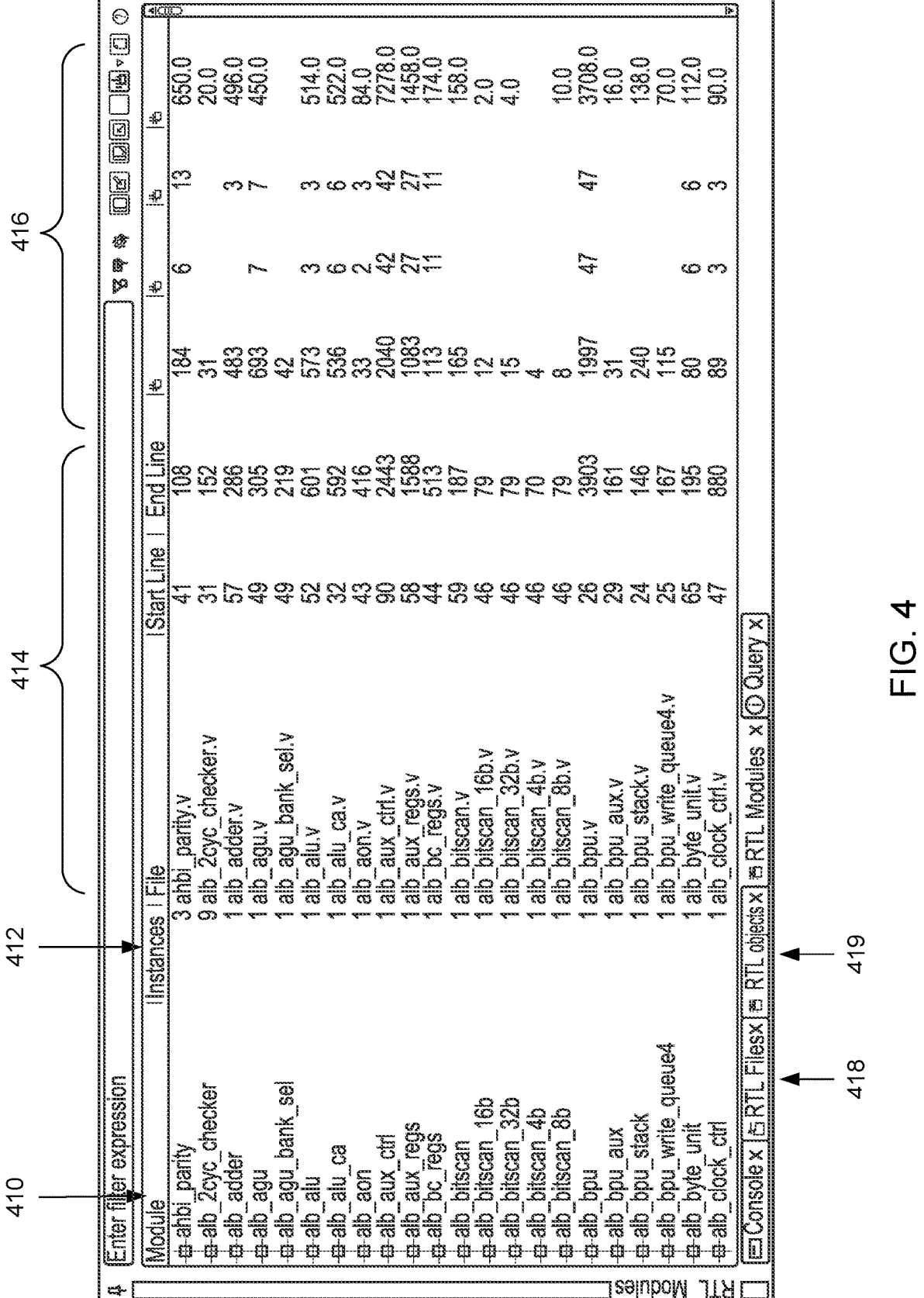
FIG. 4 shows a user interface displaying physical design metrics aggregated over RTL reference modules according to an embodiment.

FIG. 4 illustrates RTL-level metrics associated with RTL reference modules using a table format on a user interface. The left column 410 in the table lists the reference module. The next column 412 lists the number of instances of that reference module. Columns 414 of the table identify the location of the reference module by file name and line numbers. The rightmost columns 416 list various aggregated physical design metrics for each reference module. The tabs 418, 419 at the bottom of this user interface are for tables that aggregate metrics over RTL files or RTL objects, respectively.

Figure 5:
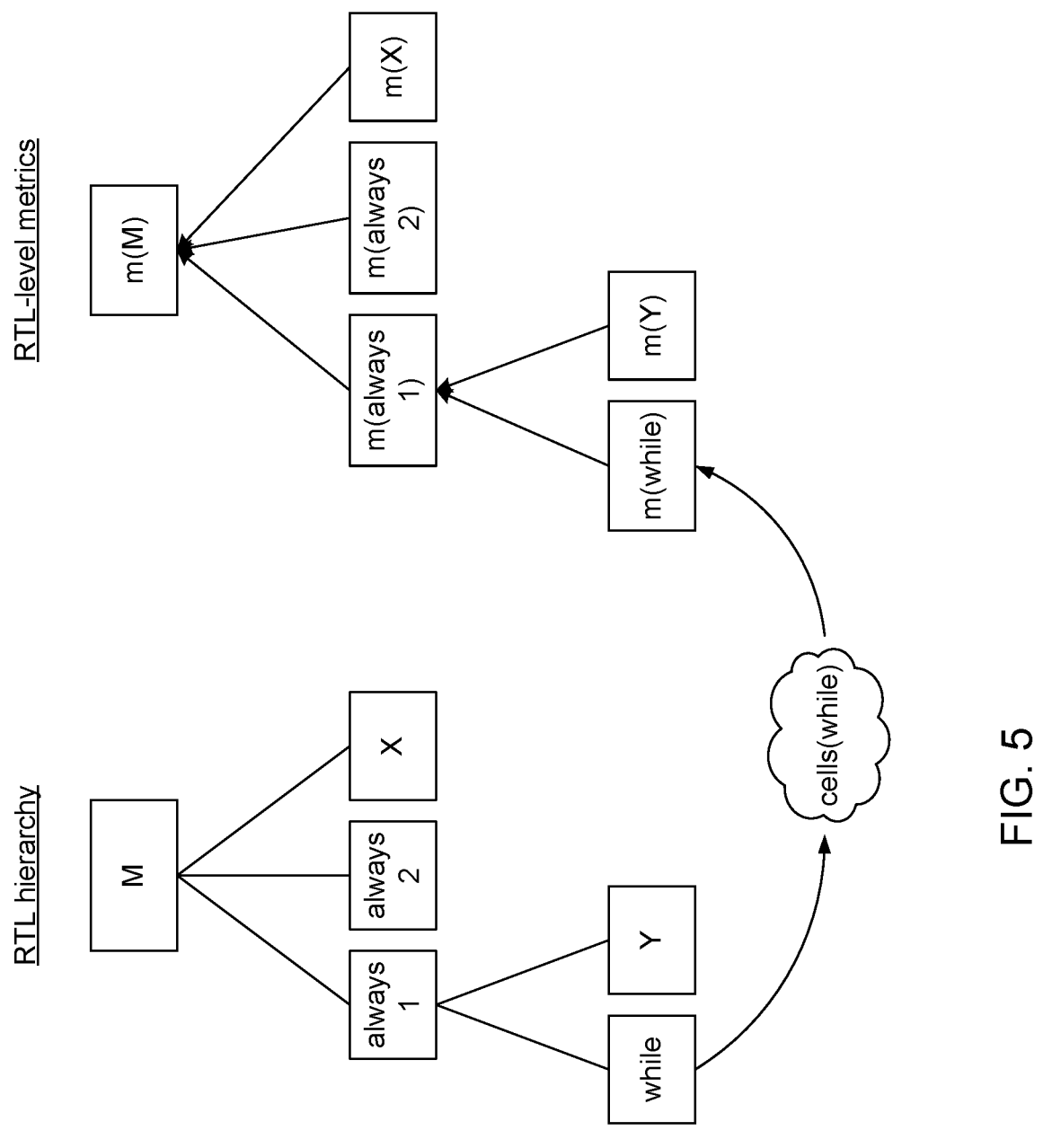
FIG. 5 shows an RTL hierarchy using module constructs according to an embodiment.

FIG. 5 shows another example using RTL module constructs. In this example, the RTL source code for module M is shown on the left. Module M includes three user-defined constructs: two always (@ blocks beginning at lines 2 and 8, and one while loop beginning at line 3. The corresponding RTL hierarchy is shown by the tree in the middle of FIG. 5. The boxes X and Y are source code lines that fall outside the constructs. Module M includes the two always@ blocks and additional code X outside these blocks (e.g., line 11 in the RTL code fragment). The first always@ block includes the while loop and addition code Y. Each of the leaf boxes in the hierarchy generates corresponding cells and aggregated physical design metrics. The while loop results in cells (while), and the corresponding metrics are aggregated to produce the RTL-level metric m (while). Similarly, metrics for the leaf boxes Y, always2 and X may be generated. These leaf metrics m(while), m(Y), m(always2) and m(X) may then be aggregated according to the hierarchy, as shown by the tree and arrows on the right of FIG. 5.

Figure 6:
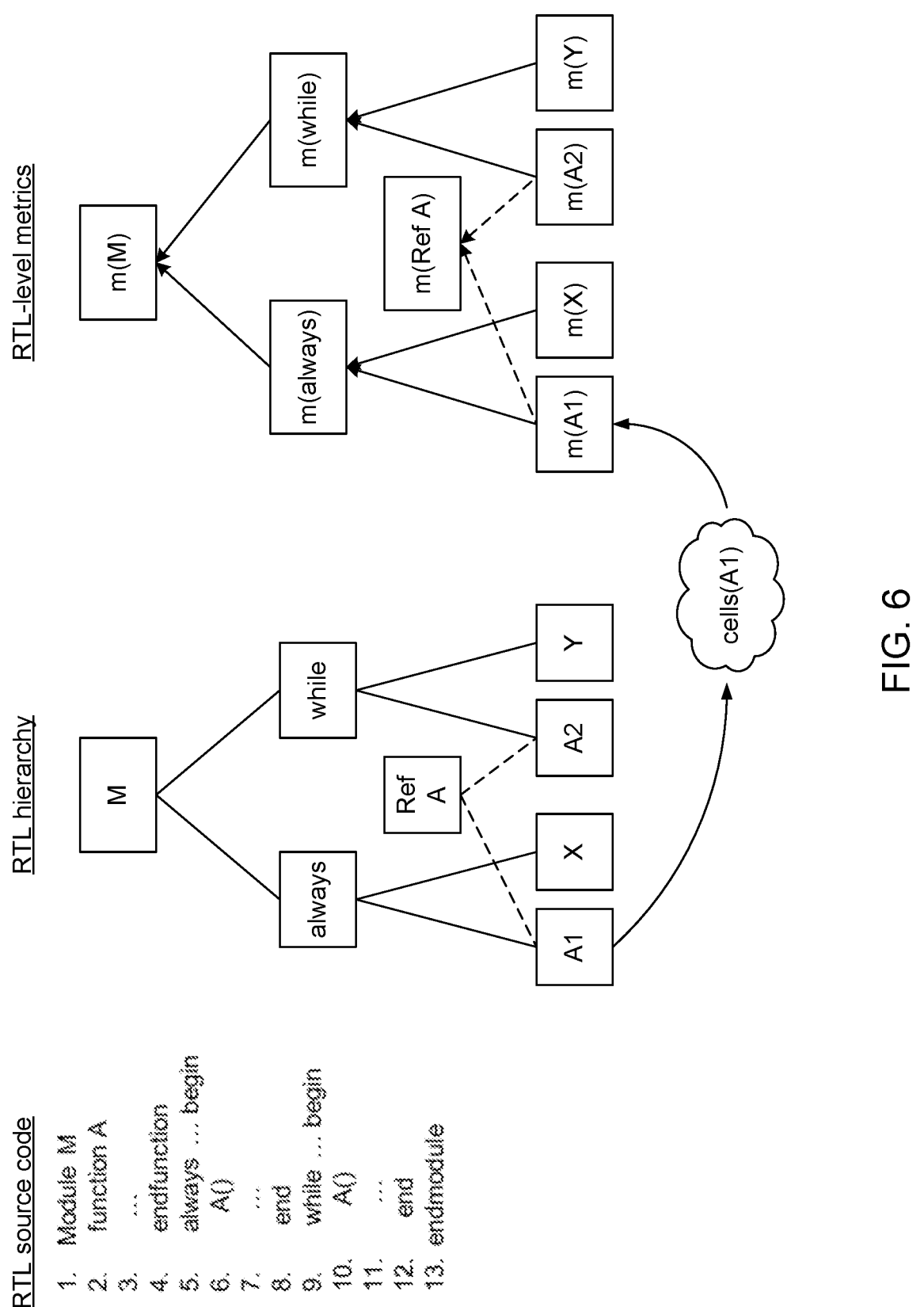
FIG. 6 shows an RTL hierarchy using reference functions according to an embodiment.

FIG. 6 shows another example. In this example, the source code for module M includes two constructs: an always@ block and a while loop. Each of these constructs includes an instance of function A, which are labelled A1 and A2 in the hierarchy tree shown in the middle of FIG. 6. The dashed lines show that instances A1 and A2 are both instances of reference function A. For the tree on the right of FIG. 6, the metrics for instances A1 and A2 may be aggregated to produce an RTL-level metric for reference function A.

Referring again to FIG. 1, the aggregation of physical design metrics in step 144 may take different forms. Some examples include summing values, taking the maximum value, taking the minimum value, and averaging values. The type of aggregation depends in part on which physical design metric is being aggregated. For some metrics, such as power consumption, the sum may be appropriate. The total power consumption for an RTL source element is the sum of the power consumption of its component parts. If worst or best case scenarios are of interest, then maximum or minimum values may be appropriate. For timing metrics, the worst or best case timing paths may be captured by the maximum or minimum of some timing metric, such as timing slack which is the difference between the maximum allowable propagation delay along a timing path and the actual propagation delay. As an example where average might be appropriate, the designer may want to know the average number of logic levels on all failing paths in a module. Aggregation may also take the form of counts. If the number of design rule violations is of interest, then the appropriate aggregation may be a total count of the number of violations in the component parts.

The techniques described herein may be applied to many different physical design metrics. Examples include metrics indicative of congestion, timing and/or power.

Congestion metrics are indicative of the local density of interconnects. Congestion metrics may be leaf cell based, which means they are associated with certain leaf cells in the physical design. The metrics associated with these leaf cells can then be aggregated as described above. An example of a congestion metric is for total congestion cells. Leaf cells located in congested areas of the physical design are identified. The total congestion cells metric for an RTL source element is the number of corresponding cells that are located in congested areas. This aggregated information indicates the amount of congestion created by that particular RTL source element.

Another example of a congestion metric is for logical congestion cells. This is similar to the total congestion cells metric, but counts only those cells that are part of a problematic logic structure which from past experience is known to create congestion, such as a multiplexer or XOR structures. In one approach, system may contain a list of such problematic logic structures. Other cells are not counted. This aggregated information indicates the extent to which a particular RTL source element contributes to one of these problematic logic structures.

Another example of a congestion metric is for channel congestion cells. This is similar to the total congestion cells metric, but counts only those cells that are located inside a channel area. The channel area is the area of the integrated circuit between macro cells.

Timing metrics are indicative of timing aspects of the design. In one approach, if a timing path violates a timing requirement, the timing metric is associated with the endpoint cell of that path. The metrics associated with these endpoint cells can then be aggregated as described above. An example of a timing metric is for slack violating endpoint cells. These are the endpoint cells of timing paths that violate some timing requirement. Slack is the difference between the maximum allowable propagation delay along a timing path and the actual propagation delay. Negative slack indicates a timing violation. Example metrics may include worst negative slack (WNS), total negative slack (TNS), and number of violating endpoints (NVP). These metrics may be aggregated across all endpoint cells corresponding to an RTL source element.

Another example of a timing metric is for logic level violating endpoint cells. Logic levels is the number of combinatorial cells along a timing path. There may be requirements that limit the logic levels along a timing path. A logic level violation occurs if the actual number of cells exceeds the allowable maximum.

Another example of a timing metric is for bottleneck cells. A cell is considered a bottleneck when the number of negative slack paths (i.e., paths which violate a timing requirement) through that cell exceeds a certain threshold. At the RTL level, this may be aggregated by counting the number of bottleneck cells among the cells corresponding to an RTL source element. Alternatively, the number of negative slack paths traversing cells that correspond to an RTL source element may be counted.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
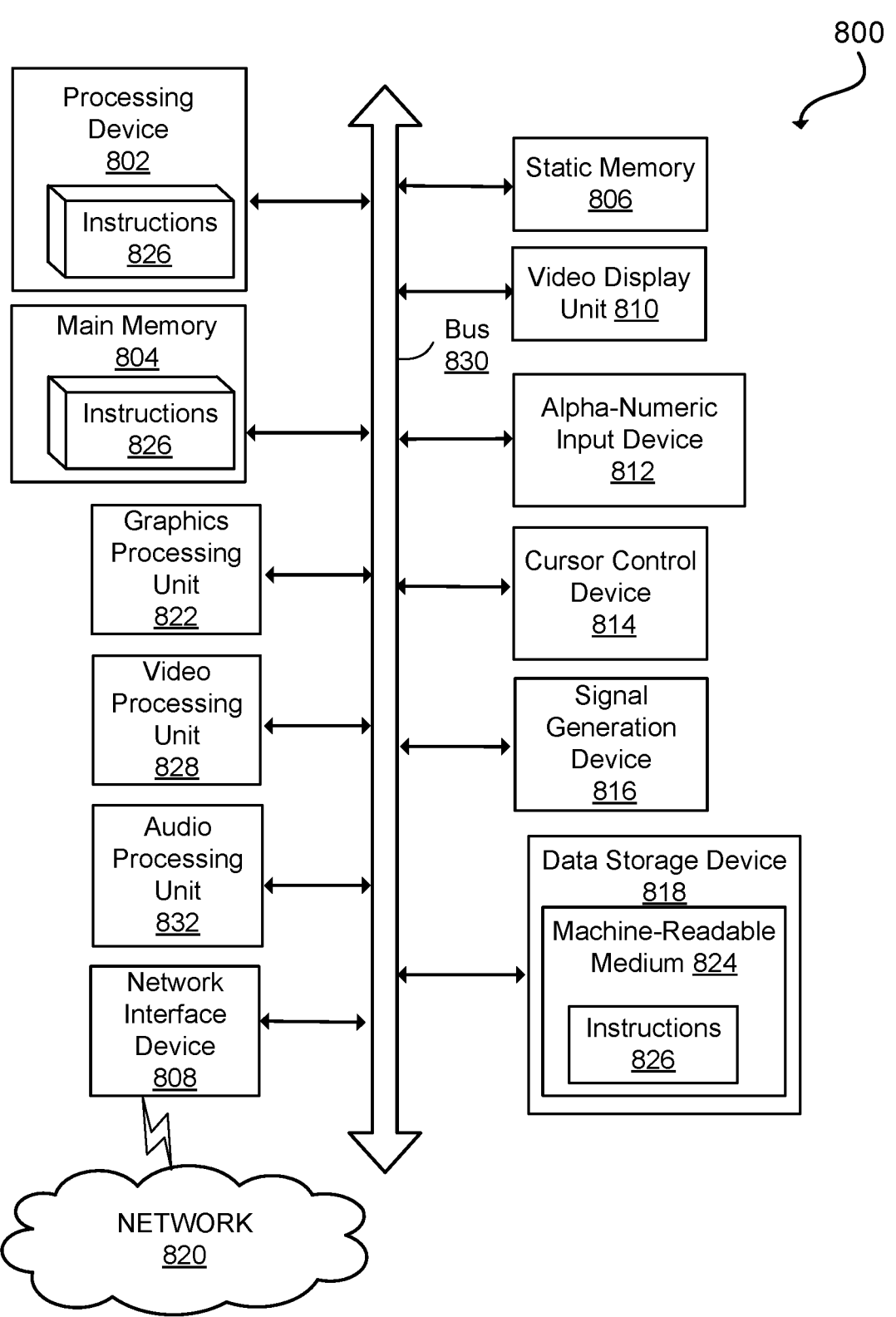
FIG. 8 is a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   accessing physical design metrics for sub-circuits from a physical design of an integrated circuit, wherein the physical design includes a layout level design and the physical design metrics are metrics that depend on the layout level design;
   determining a mapping of which sub-circuits correspond to which register transfer level (RTL) source elements, wherein the RTL source elements are portions of an RTL source code for the integrated circuit;
   for each RTL source element, aggregating, by a processing device, the physical design metrics for the corresponding sub-circuits according to the mapping; and displaying, on a user interface, the aggregated physical design metrics and corresponding RTL source elements, in a manner that associates the aggregated physical design metrics with the corresponding RTL source elements.

2. The method of claim 1, wherein the layout level design includes placement of cells within the layout level design and routing of interconnects between cells.

3. The method of claim 1, wherein the RTL source elements comprise individual lines from the RTL source code and modules from the RTL source code.

4. The method of claim 1, wherein the RTL source elements comprise user-defined constructs from the RTL source code.

5. The method of claim 1, wherein the RTL source elements comprise at least one or more of always@ blocks, while loops, and generate for loops from the RTL source code.

6. The method of claim 1, wherein:
   determining the mapping comprises determining which lines from the RTL source code generate which corresponding cells in the physical design; and
   aggregating the physical design metrics comprises, for a plurality of individual lines from the RTL source code, aggregating the physical design metrics for the corresponding cells generated by those individual lines.

7. The method of claim 6, further comprising:
   during a design flow to convert the RTL source code to the physical design, tracking the lines from the RTL source code that generate the corresponding cells in the physical design.

8. The method of claim 6, wherein the physical design metrics are physical design metrics computed for individual cells in the physical design.

9. The method of claim 1, wherein:
   the RTL source code includes a reference RTL module that is instantiated multiple times in the physical design, and
   aggregating the physical design metrics comprises, for the reference RTL modules:
      aggregating the physical design metrics across the multiple instances of the reference RTL module in the physical design.

10. A non-transitory computer readable medium comprising stored instructions, which when executed by a processor device, cause the processor device to:
   access first metrics from a first design description of an integrated circuit, wherein the first design description includes a layout level design, and the first metrics are dependent on the layout level design; and
   determine second metrics for a second design description of the integrated circuit, wherein the second design description includes a RTL source code for the integrated circuit without specification of a physical layout of the integrated circuit, and determining the second metrics comprises:
      determining a mapping of which sub-circuits from the first design description correspond to which register transfer level source elements, wherein the RTL source elements are portions of the RTL source code for the integrated circuit; and
      aggregating the first metrics for the RTL source elements, based on the mapping between sub-circuits in the first design description and the RTL source elements of the second design description.

11. The non-transitory computer readable medium of claim 10, wherein the mapping is a one-to-many mapping from RTL source elements to sub-circuits.

12. The non-transitory computer readable medium of claim 10, wherein aggregating the first metrics comprises at least one of summing the first metrics, taking a minimum of the first metrics, taking a maximum of the first metrics and averaging the first metrics.

13. A system, comprising:

a memory storing instructions; and a processor device, coupled with the memory and to execute the instructions, the instructions when executed cause the processor device to display a user interface, the user interface comprising:

first elements that display RTL source elements, which are portions of the RTL source code for the integrated circuit; and second elements indicative of aggregated physical design metrics corresponding to the RTL source elements; wherein the aggregated physical design metrics are aggregated from physical design metrics for sub-circuits from a layout level design of the integrated circuit based on a mapping of which sub-circuits correspond to which RTL source elements, the physical design metrics are metrics that depend on the layout level design, and the aggregated physical design metrics and corresponding RTL source elements are displayed in a manner that associates the aggregated physical design metrics with the corresponding RTL source elements.

14. The system of claim 13, wherein the physical design metrics are metrics indicative of congestion in the layout level design.

15. The system of claim 13, wherein the design metrics are metrics indicative of timing in the layout level design.

16. The system of claim 13, wherein the design metrics are metrics indicative of power consumption in the layout level design.

17. The system of claim 13, wherein the user interface comprises a table listing the first elements and corresponding second elements.

18. The system of claim 13, wherein the first elements comprise a source code listing from the RTL description, and the second elements comprise annotations of the source code indicative of the aggregated physical design metrics.

19. The system of claim 18, wherein the annotations are annotations on individual lines of the source code listing.

* * * * *